(12) United States Patent
Brindle et al.

(10) Patent No.: US 6,574,114 B1
(45) Date of Patent: Jun. 3, 2003

(54) LOW CONTACT FORCE, DUAL FRACTION PARTICULATE INTERCONNECT

(75) Inventors: Steven R. Brindle, Cedar Park, TX (US); Frank E. Bumb, Jr., Phoenix, AZ (US); John S. Burg, Cedar Park, TX (US); Kwang-Ho Chu, Austin, TX (US); Alexander R. Mathews, Austin, TX (US); Ronald K. Revell, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/137,150

(22) Filed: May 2, 2002

(51) Int. Cl.$^7$ .............................. H05K 7/10; H05K 7/12
(52) U.S. Cl. .................. 361/769; 174/262; 257/698
(58) Field of Search ............................ 361/769; 439/91, 439/541, 66; 174/262, 265; 257/698, 700

(56) References Cited

U.S. PATENT DOCUMENTS

| | | |
|---|---|---|
| 4,008,300 A | 2/1977 | Ponn |
| 4,209,481 A | 6/1980 | Kashiro et al. |
| 4,292,261 A | 9/1981 | Kotani et al. |
| 4,571,542 A | 2/1986 | Arai |
| 4,574,331 A | 3/1986 | Smolley |
| 4,581,679 A | 4/1986 | Smolley |
| 4,778,635 A | 10/1988 | Hechtman et al. |
| 4,820,376 A | 4/1989 | Lambert et al. |
| 5,007,841 A | 4/1991 | Smolley |
| 5,049,085 A | 9/1991 | Reylek et al. |
| 5,083,697 A | 1/1992 | Difrancesco |
| 5,109,596 A | 5/1992 | Driller et al. |
| 5,136,359 A | 8/1992 | Takayama et al. |
| 5,140,405 A | 8/1992 | King et al. |
| 5,155,302 A | 10/1992 | Nguyen |
| 5,188,702 A | 2/1993 | Takayama et al. |
| 5,228,189 A | 7/1993 | Driller et al. |
| 5,347,159 A * | 9/1994 | Khandros et al. |
| 5,430,614 A | 7/1995 | Difrancesco |
| 5,599,193 A | 2/1997 | Crotzer |
| 5,600,099 A | 2/1997 | Crotzer et al. |
| 5,672,978 A | 9/1997 | Kimura |
| 5,835,359 A | 11/1998 | DiFrancesco |
| 5,876,215 A | 3/1999 | Biernath et al. |
| 5,890,915 A | 4/1999 | Reylek |
| 6,270,363 B1 * | 8/2001 | Brofman et al. |
| 6,465,084 B1 * | 10/2002 | Curcio et al. |
| 6,524,115 B1 * | 2/2003 | Gates et al. |

FOREIGN PATENT DOCUMENTS

| | | |
|---|---|---|
| JP | 03-049105 | 3/1991 |
| JP | 08-185713 | 7/1996 |
| JP | 2000-348538 | 12/2000 |

* cited by examiner

*Primary Examiner*—Sheila V. Clark
(74) *Attorney, Agent, or Firm*—Alan Ball (57) ABSTRACT

A compliant interconnect assembly to electrically connect a first electronic device to a second electronic device comprises a contact set including an electrically insulating flexible film having at least one conductive contact suspended therein. The interconnect assembly also includes a compressible interposer as an electrically insulating elastomer sheet matrix for at least one electrically conducting elastic column to provide a localized conductive path through the thickness of the elastomer sheet. The electrically conducting elastic column comprises a central pillar of conductive spheroidal particles having a first average particle size. The central pillar has a first end opposite a second end. At least the first end has a particulate cap bonded to it including particles having a second average particle size that is less than the first average particle size. The compliant interconnect assembly is formed when the contact set lies adjacent to the compressible interposer to provide engagement between the at least one conductive contact and the at least one conducting elastic column for electrically connecting the first electronic device and the second electronic device abutting opposite sides of the compliant interconnect assembly.

16 Claims, 3 Drawing Sheets

LOW CONTACT FORCE, DUAL FRACTION PARTICULATE INTERCONNECT

FIELD OF THE INVENTION

The invention relates to interconnection of electronic components, such as integrated circuit devices and other similar devices or burn-in and test structures, all of which may have an array of closely spaced conductive contact sites. More particularly the present invention provides a geometrical array of dual-fraction particulate contacts, distributed through flexible elastomeric sheets, for reliable, low force electrical interconnection between electronic components.

BACKGROUND OF THE INVENTION

The introduction of solid-state semiconductor electronics provided the opportunity for progressive miniaturization of components and devices. One of the benefits of such miniaturization is the capability of packing more components into a given space. A drawback of miniaturization is the reduction in spacing between contacts on one device and the need for accurate alignment with corresponding contacts on a second device to provide reliable electrical interconnection between the two. Lack of planarity also affects interconnection of devices due to variation in the distance between the device contacts and an array of contacts intended to mate with the device contacts. Accurate engagement by some contacts leaves gaps between other contacts unless independent contacts have freedom to move across such gaps. Alternatively the connecting force between an array of contacts and device contacts increases to a level required for reliable interconnection, with potential for compression and damage to some of the contacts. Resilient anisotropically conductive interposers compensate for lack of device planarity to provide conductive pathways between electronic devices. Integrated circuit sockets used for performance testing, burn-in, and semi-permanent mounting to printed circuit boards employ various types of interposer during performance evaluation of finished, packaged, integrated circuit devices.

Interconnection of electronic components with finer and finer contact spacing or pitch has been addressed in numerous ways along with advancements in semiconductor device design. Introduction of ball grid array (BGA) devices placed emphasis on the need to provide connector elements with space between individual contacts at a minimum. One answer, found in U.S. Pat. No. 5,109,596 and U.S. Pat. No. 5,228,189, describes a device for electrically connecting contact points of a test specimen (circuit board) to the electrical contact points of a testing device using an adapter board having a plurality of contacts arranged on each side thereof. Cushion-like plugs made from an electrically conductive resilient material are provided on each of the contact points to equalize the height variations of the contact points of the test specimen. An adapter board is also provided made of a film-like material having inherent flexibility to equalize the height variations of the contact points of the test specimen. Furthermore, an adapter board is provided for cooperating with a grid made of an electrically insulated resilient material and having a plurality of plugs made from an electrically conductive resilient material extending therethrough. Successful use of this device requires accurate registration of contacts from the test specimen, through the three layers of planar connecting elements to the testing device.

U.S. Pat. No. 5,136,359 and U.S. Pat. No. 5,188,702 disclose both an article and a process for producing the article as an anisotropic conductive film comprising an insulating film having fine through-holes independently piercing the film in the thickness direction, each of the through-holes being filled with a metallic substance in such a manner that at least one end of each through-hole has a bump-like projection of the metallic substance having a bottom area larger than the opening of the through-hole. The metallic substance serving as a conducting path is prevented from falling off, and sufficient conductivity can be thus assured. While the bump-like projections of the anisotropic conductive films, previously described, represent generally rigid contacts, U.S. Pat. No. 4,571,542 and U.S. Pat. No. 5,672,978 describe the use of superposed elastic sheets over a printed wiring board, to be tested, and thereafter applying pressure to produce electroconductive portions in the elastic sheet corresponding to the contact pattern on the wiring board under test. In another example of a resilient anisotropic electroconductive sheet, U.S. Pat. No. 4,209,481 describes a non-electroconductive elastomer with patterned groupings of wires, electrically insulated from each other, providing conductive pathways through the thickness of the elastomer. Other known forms of interconnect structure may be reviewed by reference to United States Patents including U.S. Pat. No. 5,599,193, U.S. Pat. No. 5,600,099, U.S. Pat. No. 5,049,085, U.S. Pat. No. 5,876,215, U.S. Pat. No. 5,890,915 and related patents.

Commercial devices require some downward pressure to provide electrical connection between a device under test (DUT) and a printed circuit board or test socket attached to a load board. For this reason, conductive pathways are preferably short for optimum conductivity and ease of activation using a force sufficiently low to prevent damage to solder balls on a DUT. Reduction in activation force benefits testing at elevated temperatures where there is increased potential for damage to ball grid arrays.

In addition to the problem, mentioned previously, of interconnection failure caused by gaps between contacts, interconnection failure may occur by occlusion of a metal contact due to surface contamination with e.g. grease, non-conducting particles or a layer of metal oxide. Such an oxide layer results from air oxidation of the metal. Since oxide layers generally impede the passage of electrical current, reliable contact requires removal or penetration of the oxide layer as part of the interconnection process. Several means for oxide layer penetration, towards reliable electrical connection, may be referred to as particle interconnect methods as provided in U.S. Pat. No. 5,083,697, U.S. Pat. No. 5,430,614, U.S. Pat. No. 5,835,359 and related patents. A commercial interconnect product, described as a Metallized Particle Interconnect or MPI, is available from Thomas & Betts Corporation. The product is a high temperature, flexible, conductive polymeric interconnect which incorporates piercing and indenting particles to facilitate penetration of oxides on mating surfaces. Another commercial, electronic device interconnection product, available from Tecknit of Cranford, N.J., uses "Hard Hat" and "Fuzz Button" contacts in selected arrays. U.S. Pat. No. 4,574,331, U.S. Pat. No. 4,581,679 and U.S. Pat. No. 5,007,841 also refer to the "Fuzz Button" type of contact.

The previous discussion shows that interconnection of electronic devices has been an area subject to multiple concepts and much product development in response to the challenges associated with mechanical issues of interconnection and resultant electrical measurements. Regardless of advancements made, there is continuing need for improvement in three key areas, namely registration between interconnecting devices and electronic components, flexibility of contact sets for reliable device interconnection and minimization of the force required for reliable interconnection with low contact resistance. In view of the continuing needs, associated with interconnect structures, the present invention has been developed to alleviate drawbacks and provide the benefits described below in further detail.

SUMMARY OF THE INVENTION

The present invention provides an interposer for a compliant interconnect assembly that may be used for reliable electrical connection between electronic devices at lower contact forces than other types of particle interconnect structures. An interposer according to the present invention comprises an elastomeric sheet having holes formed in it to accommodate conductive particles that are usually held together using a resilient binder. Conductive particles, selected for their size and shape, form conductive columns that provide electrical pathways through the elastomeric sheet. The arrangement of conductive columns in the elastomer produces an anisotropic or z-axis conductive sheet. Individual conducting columns have low contact resistance and respond to low compression force when used in a compliant interconnect assembly that connects a semiconductor device for testing. Compliant interconnect assemblies according to the present invention operate at low contact forces, e.g. as low as 12 g, while sustaining a large number of actuation cycles including effective cyclic actuation over a temperature range from <0° C. to about 125° C. Other applications of a compliant interconnect assembly, according to the present invention, include use as a contactor, a production socket, a burn-in socket, a probing device, a board to board interconnect, as a device to device interconnect and similar applications.

Anisotropic interposers included in a compliant interconnect assembly are part of a low profile, rugged structure designed for solderless, releasable and remateable connections to delicate IC packages using low actuation forces. Repeated cycling between connect and disconnect configurations, over extended time periods, reveals the stability of contact resistance and reliable electrical performance of electrically conductive particle columns according to the present invention. Preferably, particles used to form the conductive paths through elastomeric sheets have substantially the same size or fall in one or more relatively narrow and substantially uniform size distributions. Particle size and shape affect contact resistance. Reduction in contact resistance usually occurs as particle size increases and the shape approaches spherical or at least spheroidal.

A single size distribution of relatively large particles in electrically conducting columns has a disadvantage of displacement and loss of individual particles during multiple connect/disconnect cycles. This may occur even in the presence of particle binders. Any loss of conductive particles changes the geometrical condition of the connecting surface of a conducting column. Changing geometry may interfere with contact reliability, resulting in an increase in contact resistance. A conductive column including a dual-fraction particle structure overcomes the problem of particle loss. Suitable conductive columns have a first conductive particle fraction or average size distribution covered, at least at one end, by a second conductive particle fraction having an average particle size distribution that is significantly smaller than the first. The smaller particle size material provides a cap over one or both ends of a central pillar that includes one or more layers of the particles of larger particle size. A binder holds together conducting columns according to the present invention having a dual-fraction particle structure. Cap forming particles have a size distribution from about 6 $\mu$m to about 40 $\mu$m, while the central pillar includes particles ranging in size from about 80 $\mu$m to about 180 $\mu$m.

To achieve low contact resistance, the application of force to compress a conductive column preferably acts to align particles in the direction of the longitudinal axis of the column. Lateral movement of particles interferes with interparticle contact and increases contact resistance. There is a relationship between contact resistance and the hardness of the elastomer surrounding each dual-fraction particle column. As the hardness of the elastomer increases the contact resistance of conductive columns, in an interposer sheet, tends to decrease. While not wishing to be bound by theory, a harder elastomer restricts lateral movement of particles to favor alignment in the desired direction parallel to the longitudinal axis of the column. Particle alignment may be further enhanced if the particles have a substantially spherical shape.

More particularly, the present invention provides a conductive, Z-axis, particulate connector comprising an electrically conducting elastic column including a central pillar of conductive spheroidal particles having a first average particle size. The central pillar has a first end opposite a second end and a particulate cap extending from at least the first end of the central pillar. A particulate cap includes particle layer having a second average particle size. The second average particle size is less than the first average particle size. A cured elastomer binds the spheroidal particles and the particle layer to form the electrically conducting elastic column.

The present invention also provides a compressible interconnect comprising an electrically insulating elastomer sheet and at least one electrically conducting elastic column occupying a hole formed in the elastomer sheet, to provide a localized conductive path through the thickness of the insulating elastomer sheet. The at least one electrically conducting elastic column has a central pillar of conductive spheroidal particles of a first average particle size. The central pillar further has a first end opposite a second end, at least the first end contacting a particulate cap including particles having a second average particle size, which particle size is less than the first average particle size.

In addition, the present invention provides a compliant interconnect assembly to electrically connect a first electronic device to a second electronic device. The compliant interconnect assembly comprises a contact set including an electrically insulating flexible film having at least one conductive contact suspended therein. The interconnect assembly also includes a compressible interposer as an electrically insulating elastomer sheet matrix for at least one electrically conducting elastic column to provide a localized conductive path through the thickness of the elastomer sheet. The electrically conducting elastic column comprises a central pillar of conductive spheroidal particles having a first average particle size. The central pillar has a first end opposite a second end. At least the first end has a particulate cap bonded to it including particles having a second average particle size that is less than the first average particle size. The compliant interconnect assembly is formed when the contact set lies adjacent to the compressible interposer to provide engagement between the at least one conductive contact and the at least one conducting elastic column for electrically connecting the first electronic device and the second electronic device abutting opposite sides of the compliant interconnect assembly.

Definitions

Terms used herein have the meanings indicated as follows:

The term "compressible interposer" or "flexible interposer" or similar terms refers to a z-axis conducting structure formed from an elastomeric sheet having through-holes or vias to accommodate columns of conductive material to provide electrical current-carrying pathways through the elastomer sheet. An interposer forms part of a compliant interconnect assembly according to the present invention.

A "compressible interconnect" or "flexible interconnect" or the like, as used herein, identifies a z-axis conducting structure formed from an elastomeric sheet having through-holes or vias to accommodate columns of conductive material to provide electrical current-carrying pathways that provide direct connection between electronic devices or electronic devices and printed circuit boards or load boards or the like.

As used herein "conducting elastic column" or "conductive column" or like terms refer to an electrically conducting channel providing an isolated current carrying pathway through a hole passing through the thickness of an elastomer sheet matrix. A conducting elastic column, being electrically isolated from its nearest neighbors, forms part of a z-axis conducting structure.

The terms "central pillar" or "mid-pillar" or "pillar portion" may be used interchangeably to identify a portion of a conducting elastic column that includes spheroidal particles.

The use of the term "spheroidal" relates to substantially symmetrical particles having a shape including rounded surfaces. A uniform sphere is the most symmetrical for spheroidal particle.

"Actuation force" refers to the average weight applied to provide reliable electrical connection in a pathway that includes a conducting elastic column.

"Contact resistance" refers to the electrical resistance of the electrical current conducting pathway, between interconnected devices, during application of an actuation force to a compliant interconnection assembly, or compressible interconnect according to the present invention.

A record of the "number of actuations" indicates the number of make and break connections that may be made, using a compliant interconnect assembly or compressible interconnect, during device burn-in and testing without exceeding a desirable level of actuation force and contact resistance.

BRIEF DESCRIPTION OF THE DRAWINGS

Notwithstanding any other forms, which may fall within the scope or the present invention, preferred forms of the invention will now be described, by way of example only, with reference to the accompanying drawings in which.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Figure 1:
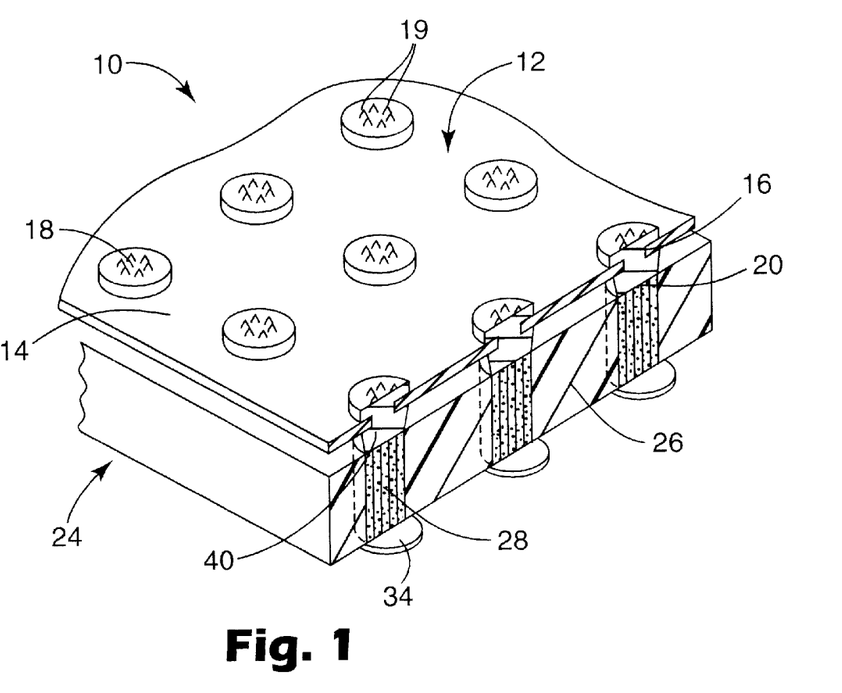
FIG. 1 is a perspective view showing a contact set and compressible interposer according to the present invention.

Referring now to the drawings wherein like numbers refer to like parts throughout the several views, FIG. 1 shows a compliant interconnect assembly 10, comprising a contact set 12 and a compressible interposer 24 according to the present invention. The contact set 12 includes a flexible film material 14 that has conductive contacts 16 received and suspended in holes (not clearly shown) machined through the thickness of the film 14. Since the conductive contacts 16 require electrical isolation from each other, the flexible film 14 is electrically non-conductive. Patterns of conductive contacts 16 in the contact set 12 may take any form depending on the corresponding contact patterns on electronic devices to be interconnected. Preferably the conductive contacts 16 are essentially rigid, non-compliant contacts held in the holes in the flexible film 14 such that portions of the conductive material overlap the upper and lower edges of the holes, protrude on either side of the flexible film 14 and have upper 18 and lower 20 contact surfaces. For optimum interconnection the upper contact surfaces 18 preferably possess coplanarity in a plane above the flat, flexible film 14 with similar coplanar relationship of the lower contact surfaces 20 in a plane below the flexible film 14. The upper contact surface 18 of each conductive contact 16 may include pointed projections 19, also referred to herein as engineered asperities. Engineered asperities 19 are sharp tipped barbs of suitable hardness to penetrate any oxide coating present at the surface of device contacts that may be engaged, for electrical interconnection, by the contact set 12 according to the present invention. While the portion of the conductive contact 16 above the surface of the film 14 has a surface designed for optimum contact with an electronic device, the design of the portion of the conductive contact 16 below the film focuses contact force at the interface between a conductive contact 16 and a conducting elastic column 28.

There are two methods for forming a compressible interposer 24 according to the present invention. One method requires the formation of a perforated planar sheet of elastomer by casting it inside a rigid frame before curing. The second method uses a pre-cured planar sheet of elastomer 26 with the desired dimensions. Holes drilled in the elastomer sheet 26 provide channels for electrically conducting elastic columns 28 that have exposed ends at opposite faces of the elastomer sheet 26. A preferred method of forming a compressible interposer 24, using silicone elastomer compositions, includes providing a planar sheet 26 of silicone elastomer, preferably a platinum-catalyst cured silicone elastomer 1.0 mm (0.04 inch) thick having a spacer layer of protective tape overlying both sides of the planar sheet. Silicone adhesive provides attachment of the protective tape to form this laminated structure. The tape should be transparent to allow observation of intimate contact between the layers, without entrapment of air bubbles. A drilling sequence provides a hole or via pattern in the laminate structure according to the contact pattern of an electronic device to be interconnected or tested.

Vias formed during the drilling sequence require filling with conductive particles to provide conductive pathways through an elastomer sheet 26. The process of filling the vias typically uses a slurry-like blend of conductive particles in a binder. A knife coater or similar applicator device may be used to force the particulate slurry into the holes or vias. In a dual fraction, conducting column structure, filling with larger spheres precedes addition of a slurry of small particles to fill the open area at the ends of each column making the exposed surfaces of the column planar with the surfaces of the taped silicone rubber sheet. Once filled, each hole contains a column of conductive particles. The fluid, particle-containing, conductive slurry, placed in each hole, requires curing to form electrically conducting elastic columns 28 through the elastomer sheet 26. Preferably conductive slurries according to the present invention comprise curable silicone compositions containing conductive particles including, but not limited to symmetrical and randomly shaped particulate metals such as silver, copper, nickel, silver coated metals, metal coated glass or ceramic particles, metal coated polymer particles and conductive carbon particulates and the like. The silicone binders cure in the presence of moisture or heat or a combination of the two.

After curing of the conducting elastic columns 28, removal of the spacer layer of tape, from both sides of the laminate, reveals a geometrical arrangement of column tips sized according to the column diameters and thickness of the spacer layer. Before use, the compressible interposer 24 requires cleaning to remove surface contamination and debris. Thus formed, compressible interposers 24 have attributes including precise construction, high flexibility, high resilience, high durability and low profile. They provide interconnect devices emulating springy conductors, sometimes referred to as pogo pins, without any mechanical biasing elements such as springs.

Previously described contact sets 12 and compressible interposers 24 provide z-axis conducting interconnect structures. Such interconnects may be used alone or in combination to provide conductive paths between electrical or electronic components, particularly those electronic devices having the fine contact pitch associated with semiconductor devices. For example, an interposer 24 according to the present invention provides connection either between two printed circuit boards or positioned in a production socket for semi-permanent mounting of a flat device such as a land grid array (LGA) or a quad flat no-lead (QFN) device, where repeated make-and-break cycling is not a requirement.

Figure 2:
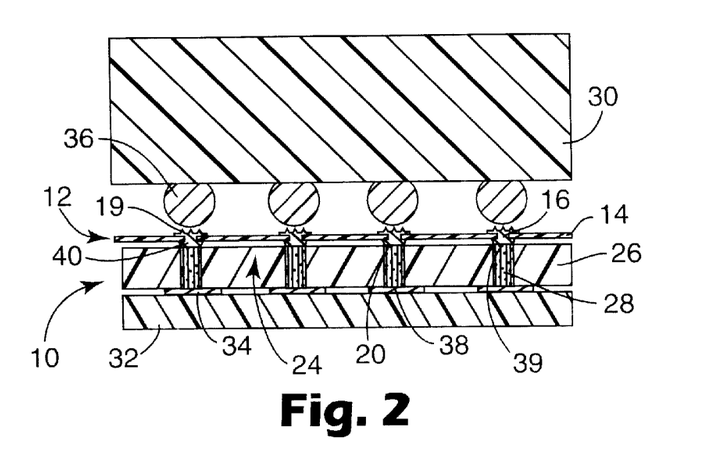
FIG. 2 is a cross sectional view depicting a compliant assembly, according to the present invention, positioned between electronic devices for electrical connection thereof.

Having described the formation of a compressible interposer 24, reference is made to FIG. 2 to show how parts of an interconnect assembly 10 preferably work together for low contact force interconnection between electronic devices and an electronic device and a test board, for example. FIG. 2 includes an electronic device 30 that uses the ball elements 36 of a ball grid array (BGA) for interconnection with a load or test board 32. Connection points on the load or test board 32 take the form of planar contacts 34. Interconnection of the electronic device 30 to the load or test board 32 may utilize a compliant interconnect assembly 10 according to the present invention. Preferably a compressible interposer 24 makes contact with the load or test board 32 by way of the lower contact faces 38 of the conducting elastic columns 28. The upper contact faces 39 of the conducting elastic columns 28 engage the tail portion 40 of corresponding conductive contacts 16 held in the flexible insulating film 14. Engineered asperities 19 on the top surface 18 of the conductive contacts 16 make reliable contact with the BGA by penetrating or abrading or otherwise disrupting any oxide covering that may have formed on the ball elements 36 of the BGA. The arrangement of electronic device 30, contact set 12, compressible interposer 24 and load or test board 32, allows convenient passage of current between the device 30 and the load board 32. This type of interconnection benefits from the reduced force needed to provide reliable connection. Connection force reduction relies upon attributes associated with both the contact set 12 and the compressible interposer 24. For example, the sharpness of the engineered asperities 19 assures essentially instant, current conducting electrical contact without concern to the surface condition of the ball elements 36 of the BGA. Therefore, little force need be applied to connect the BGA to the contact set 12. On the other side of the flexible sheet 14, the shape of the tails 40 of the conductive contacts 16 has a design for efficient interaction with the upper contact faces 39 of the conducting elastic columns 28 of the compressible interposer 24. The contact surface 20 of the tail 40 is slightly smaller in area than the contact face 39 that projects from the face of the elastomer sheet 26 holding the conducting elastic columns 28. This projecting contact face 39, not being confined by the main body of elastomer 26, is somewhat more flexible than the body of the conductive column 28. Similarly the compliant projection associated with the lower contact surface 38, of a conducting elastic column 28, allows slight spreading and thereby slightly increased area of contact between the lower contact face 38 and a planar contact 34 of a load or test board 32. The combined effect of engineered asperities 19 and compliant projections allows the lowering of connection forces into a range of about 10 g to about 50 g per contact.

Figure 3:
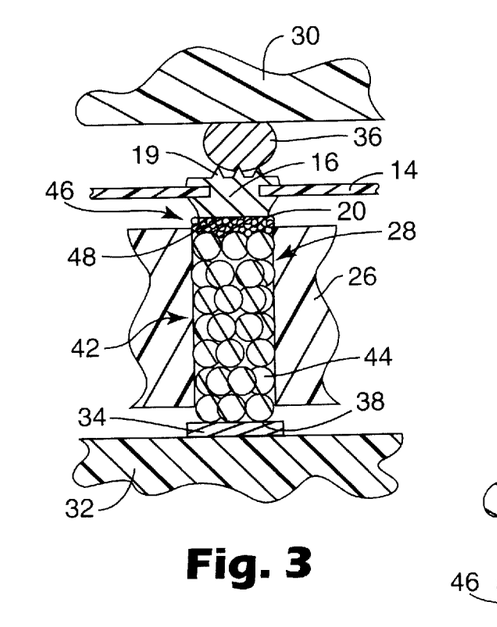
FIG. 3 is a cross section providing detail of the alignment of parts forming an electrically conducting path between electronic devices.
Figure 4:
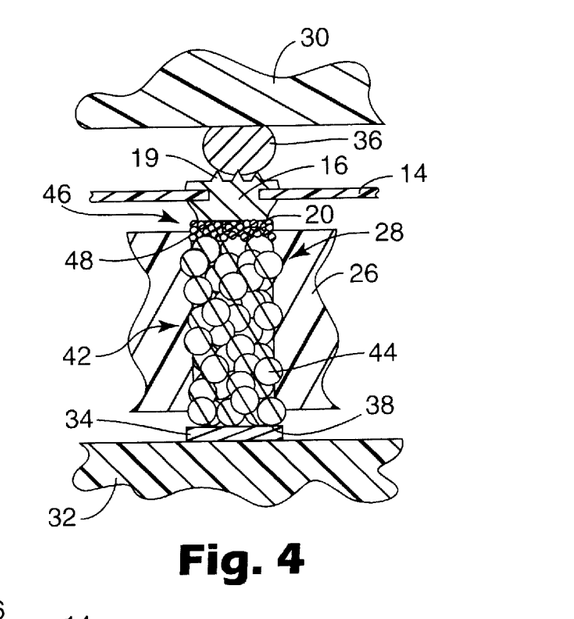
FIG. 4 is a cross sectional view depicting the electrically conductive path, between electronic devices, as it would appear under compression.

FIG. 3 and FIG. 4 provide added detail of the interconnection of a single ball element 36 of a BGA with a contact pad 34 of a load or test board 32 using a compliant interconnect assembly 10 according to the present invention. FIG. 3 shows the parts in alignment without added pressure for reliable interconnection. Each conducting elastic column 28, included in the geometrical array of z-axis conducting contacts of an anisotropic conducting elastomeric compressible interposer 24, comprises a mid-pillar or central pillar 42 portion of one or more layers of relatively large spheroidal particles 44. Holes drilled in an elastomer sheet 26 have a diameter determined as an appropriate fraction of the free space between lead centers so as to connect a device lead to a PWB or load board land without contacting other device leads or lands. The size of spheroidal particles 44 to fill each hole may be derived by modeling or calculation so that preferably no more than five spheroidal particles 44 fit inside a hole on any one layer. Particle count variation is preferably two or less between layers. For example, using a particle size to available space relationship to allow up to five particles per layer, based on hole diameter, the target for particle variation allows a minimum of only three particles in a layer.

Exposed spheroidal particles 44 alter the contact force and contact resistance of conducting elastomeric columns 28 in a variety of ways depending on coplanarity of spheroidal particle 44 surfaces and the stability of the conducting particle columns 28. Used alone, spheroidal particles 44 tend to dislodge during device testing in which the device or contact set impinges the end of a conductive column 28. In the absence of coplanarity exposed conductive spheres 44 will not make optimum contact with contacting surfaces of target devices. Also, repeated make and break contacting cycles may cause affected spheroidal particles 44 to loosen, thereby becoming dislodged from a conducting elastic column 28. Both of these conditions change the characteristics of the connection between a conducting elastic column 28 and a target device necessitating an increase in actuation to overcome increased contact resistance.

Particle displacement occurs more readily when there is variation in the height of the end layers of spheres 44 or the device or contact set 12 approaches the conductive column 28 at an angle that deviates from vertical. Addition of cap material 48 to one or both sides of central pillars 42 makes them more robust while producing a surface, at the end of a conducting elastic column 28, more planar than columns 28 using only large spheroidal particles 44. Compact packing of cap material 48 provides a wear-resistant surface for efficient force and displacement transfer from e.g. a contact set 12 to the conducting elastic columns 28 of a compressible interconnect 24 according to the present invention.

Formation of caps 46 over either end of the columns 28 reduces loss of spheroidal particles 44 during device testing. Smaller particle size material provides the conductive cap 46 over one or both ends of the central pillar 42. The caps 46, which should be conductive in this case, include a binder material and conductive particles 48. Preferred particles 48 for cap 46 formation are precipitated unsymmetrical particles, of irregular shape, having a wide size distribution so that spaces between larger particles become filled for maximum contact between conducting particles and compacting of the smaller cap particles 48 into a relatively rigid structure. Alternative particle types include spherical, or cylindrical shaped particles. Suitable conductive materials, in particulate form, include conductive carbon black, silver, copper, gold, nickel, or other conductive metals or conductive composites such as metal coated glass, ceramic or polymer particles. Cap material 48 extends from central pillars 42 of spheroidal particles 44 to set the correct height and co-planarity of an anisotropic interposer 24 for even contact with the contacts 16 on a contact set 12 or device. The contact geometry has an effect on column integrity. Rounded contacts cause more damage to unprotected spheroidal particles 44 than flat contacts. Particulate caps 46 are effective with both types.

FIG. 4 shows the expected configuration with contact force applied to effect suitable connection for passage of electric current through a single connection point. To achieve this condition the conductive elastic columns 28 require application of force to reduce the height of individual columns by between about 15% and about 30% of their uncompressed height. Application of compressive force places the flat bottom face 20 of the tail 40 of the conductive contact 16 against the nearly planar surface of the compacted cap 46. This directs the force to the central pillar 42 of the conductive spheres 44. Contact pressure, concentrated along the vertical axis of a conducting elastic column 28, causes the layers of spheres 44 to expand as the height of the conducting elastic column 28 decreases. As the layers of spheres 44 expand the diameter of each conducting elastic column 28 increases to the extent allowed by the restraining influence of the surrounding elastomer sheet 26.

The contact surface 20 of the tail 40, of a contact in a contact set, is slightly smaller in area than the contact face 39 of a conducting elastic column 28. Preferably the contact tail 40 diameter is larger than the size of a circle (see FIG. 5) defined by the top layer of spheroidal particles 44, but smaller than the overall diameter of the conducting elastic column 28, whether or not a cap 46 is in place. The relative sizing causes the contact 16 to act like a piston, pushing vertically down on the conductive elastic column 28. A conductive cap 46 aids efficient force transfer by providing a planar and substantially rigid top surface to the column 28 so that underlying layers of larger spheres 44 become compressed by vertical application of a uniform force. The dual particle fraction conducting elastic column 28, including both a central pillar 42 and end-caps 46, has a design for efficient transfer of force and displacement to reduce contact force and contact resistance associated with a reliable compressible interconnect 24 or compliant interconnect assembly 10.

Figure 5:
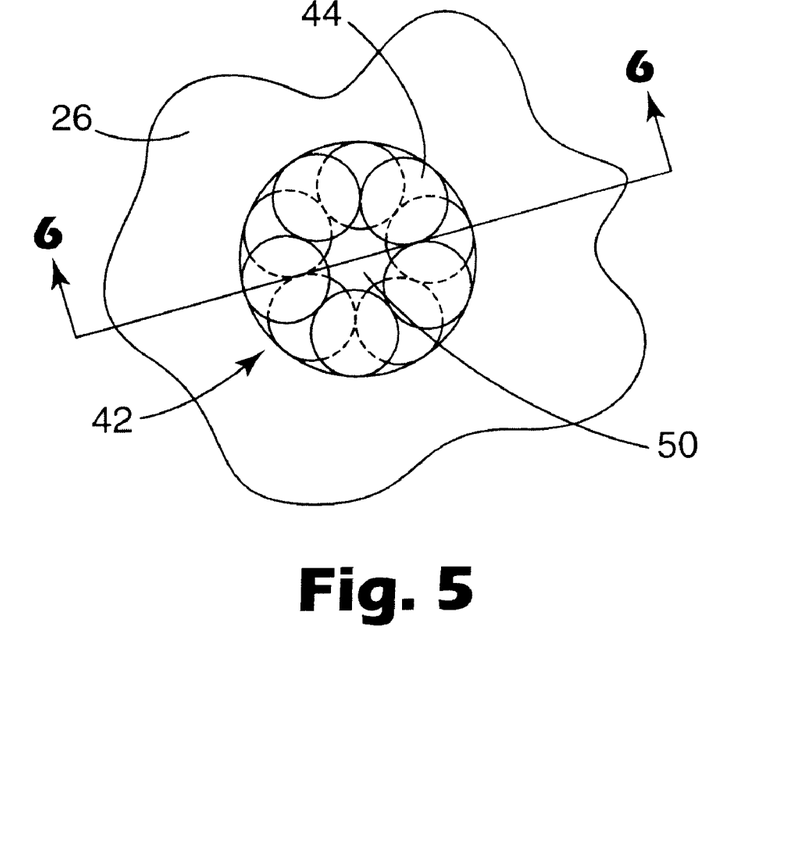
FIG. 5 shows a diagrammatic representation of a cross section corresponding to line 5—5 of FIG. 3.

FIG. 5 shows the cross section of a relaxed conducting elastic column 28 of FIG. 3 corresponding to line 5—5. This shows that the center of each spherical particle 44 in a given row will be directly aligned with the gap between spheres 44 in the rows above and below that row. While not wishing to be bound by theory, it is believed that sizing of spherical particles 44 produces a central pillar 42 structure in which no sphere 44 occupies a position directly aligned above or below the center of another sphere 44. Spherical particles 44 positioned in this way produce hollow central pillars 42 having an axial cavity 50 surrounded by rings of spheroidal particles 44 stacked in multiple layers.

The particle count per layer controls the space at the center of a spheroidal particle 44 layer. Preferably, the axial cavity 50 has a diameter smaller than any of the spherical particles 44 to prevent a particle 44 falling into the axial cavity 50. If this were to occur, part of the central pillar 42 could include spheroidal particles 44 having the same centerline, which makes a conducting elastic column 28 less compressible, thus increasing its actuation force.

With suitable particle size selection, the radius of the space at the center of a layer of spherical particles 44 is less than the average radius of the spherical particles 44 themselves. For layers containing six or more spherical particles 44, calculations indicate that the radius of the space, at the center of a layer, either equals or exceeds the average particle radius. This condition allows layers to form with a stack of aligned spheroidal particles 44 occupying the axial cavity 50, held in position by the surrounding particle arrangement. Thus stacked, the spheroidal particles 44 in the center produce a relatively rigid structure. Lacking compliance, conductive elastic columns 28 including axial particles adapt poorly to lack of co-planarity associated with mating contact arrays of electronic devices and related wiring structures. For this reason, five is the maximum preferred number of spheroidal particles 44 in any layer of the central pillar 42.

Figure 6:
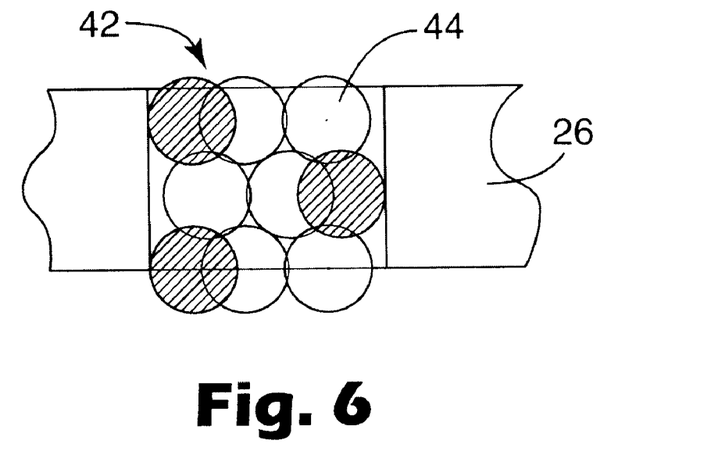
FIG. 6 provides a diagrammatic representation of a cross section, taken through line 6—6 of FIG. 5, showing several layers of spherical particles in a central pillar of a conducting elastic column interconnect according to the present invention.

FIG. 6 provides another cross-sectional view of the central pillar 42 portion of a conducting elastic column 28 viewed as indicated by line 6—6 of FIG. 5. This also shows the preferred arrangement of spherical particles 44 wherein spheres 44 in adjacent layers do not align on the same centerline. The compressive force to produce a conductive path in a conducting elastic column 28 appears to be lowered when conducting spheres 44 are not directly above each other. As indicated above, spheres 44 stacked directly above each other, on the same centerline, produce substantially incompressible columns of spheroidal particles 44. Preferably a layer of spherical particles 44 contains between three and five conductive particles 44 that have limited movement during application of low contact force (between about 5 g and about 50 g) to provide conducting columns 28 having contact resistance values in a range from about 50 mohms to about 2000 mohms.

Figure 7:
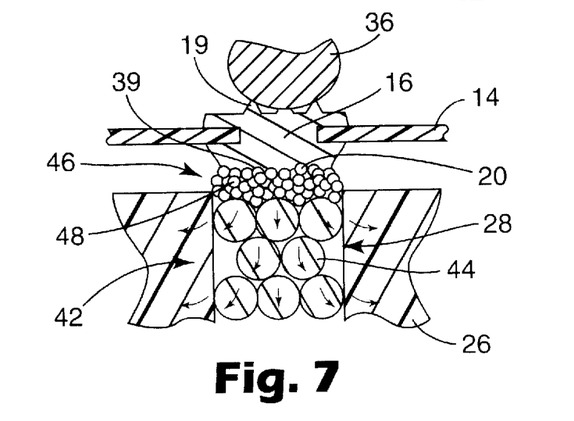
FIG. 7 is a cross sectional detail view of a portion of the compressed conducting elastic column.

FIG. 7 is a cross-sectional view in which arrows indicate the anticipated movement of spherical particles 44 under the compressive forces associated with multiple interconnections of electronic components during device testing. The particulate cap 46 transmits downward, essentially vertical pressure, from the contact 16, to the central pillar 42 of conducting spheres 44. In response, the spherical particles 44 move and a layer of spheres 44 expands laterally until prevented from further outward movement by resistance from the surrounding elastomer sheet 26.

Variation in the elastic behavior of the elastomer sheet 26 support media produces variability in contact force and electrical resistance associated with an anisotropic interposer 24 according to the present invention. Using the interconnection scheme shown in FIG. 2, actuation, to connect a device to a test board 32, causes lateral displacement of the spheroidal particles 44. Substantially smooth spheroidal particles 44 tend to slide or roll more laterally than vertically. Reduction of lateral movement appears to lower contact resistance and the corresponding force required for electrical connection across an anisotropic interposer 24. One means to limit lateral movement of spheroidal particles 44 is to increase the elastic strength of the elastomeric support 26. Harder elastomers are more effective in concentrating applied force along the longitudinal axis of the conducting column 28. A contact force so-applied lowers the electrical resistance between a device lead and the land or planar contact pad 34 of a test board 32 or other printed wiring board. This provides a high performance connection having low resistance, low capacitance and low inductance, for handling high frequency device connections. Further, it appears that flexible interposers 24 using higher modulus elastomers show greater stability and longer life in terms of connect/disconnect cycles during electronic device testing. Table 1 shows reduction in contact resistance and extended use with multiple actuations of a compliant interconnect assembly 10 according to the present invention. Improved performance may be attributed to the use of elastomeric sheets 26 having increasing hardness.

TABLE 1

Contact Resistance Variation Versus Actuation Frequency

| Example | Elastomer Properties | Number of Actuations | Contact Resistance (mohms) |
|---|---|---|---|
| 1 | Low modulus | 0 | 100–300 |
| | | 8,000 | 200–2,000 |
| | | 13,000 | 2,500-insulative |
| 2 | Medium modulus | 0 | 50–300 |
| | | 8,000 | 50–600 |
| | | 25,000 | 50–1,000 |
| | | 36,000 | 50–750 |
| | | 53,000 | 50–1,300 |
| | | 62,000 | 50–1,500 |
| 3 | High Modulus | 0 | 40–125 |
| | | 12,000 | 50–125 |
| | | 30,000 | 60–150 |
| | | 60,000 | 100–180 |
| | | 70,000 | 80–180 |
| | | 92,000 | 54–235 |
| | | 105,000 | 60–240 |
| | | 120,000 | 55–225 |

A harder elastomer limits the lateral movement of spheroidal particles 44 in a central pillar 42. This suggests that maintaining the contact force as vertical as possible, i.e. allowing minimal lateral movement of spheroidal particle 44 layers, leads to lowering of the effective contact resistance. Another size consideration for optimum interconnection is the requirement that the planar contact pad 34 of the load or test board 32 has a diameter of suitable size to allow spreading of the lowest layer of spheres 44 without overlapping the edge of the planar contact pad 34, since this ruins efficient force transfer, and raises the force and displacement needed for effective interconnect.

The ratio of the diameter of a conducting elastic column 28 to the size of a spherical conductive particle 44 may be from about 2:1 to about 2.7:1. Preferably, the diameter of the conducting elastic columns 28 is about 325 μm (13 mils) and the spherical conductive particles 44 have a diameter of 150 μm (6 mils). The conducting elastic columns 28 extend beyond the top and bottom of the matrix elastomer from about 50 μm (2 mils) to about 100 μm (4 mils). A binder holds the central pillar 42 spherical particles 44 and cap 46 forming particles 48 together to provide conducting elastic columns 28 having a dual-fraction particle structure according to the present invention. The binder elastomer was mixed with the large spheroidal particles 44 at a ratio from about 6.0% to about 9.0%, which is slightly below the amount needed to theoretically fill up all of the voids between the spheroidal particles 44. A ratio of binder to cap forming particles 48 is preferably from about 17% to about 19%. Mixtures of binders and particles placed at the end of central pillars 42 according to the present invention provide a uniform projection having a substantially planar surface extending from the elastomer 26 surface from about 50 μm (2 mils) to about 75 μm (3 mils). Cap 46 forming particles 48 have a size distribution from about 6 μm to about 40 μm, while the central pillar 42 preferably includes spherical particles 44 having a size distribution from about 80 μm to about 180 μm depending on conducting column 28 diameter.

A compliant interconnect assembly and its components have been described herein. These and other variations, which will be appreciated by those skilled in the art, are within the intended scope of this invention as claimed below. As previously stated, detailed embodiments of the present invention are disclosed herein; however, it is to be understood that the disclosed embodiments are merely exemplary of the invention that may be embodied in various forms.

What is claimed is:

1. A conductive, Z-axis, particulate connector comprising:
   an electrically conducting elastic column having a column diameter, said electrically conducting elastic column further including:
   a central pillar of conductive spheroidal particles having a first average particle size, said central pillar further having a first end opposite a second end;
   a particulate cap extending from at least said first end of said central pillar, said particulate cap being formed of a particle layer having a second average particle size, said second average particle size being less than said first average particle size; and
   a cured elastomer binding said spheroidal particles and said particle layer to form said electrically conducting elastic column.

2. The conductive, Z-axis, particulate connector of claim 1, wherein said first average particle size is from about 80 μm to about 180 μm.

3. The conductive, Z-axis, particulate connector of claim 1, wherein said second average particle size is from about 6 μm to about 40 μm.

4. The conductive, Z-axis, particulate connector of claim 1, wherein the ratio of said column diameter compared to the size of a said spheroidal particle is from about 2:1 to about 2.7:1.

5. The conductive, Z-axis, particulate connector of claim 1, wherein said cured elastomer is a silicone elastomer.

6. The conductive, Z-axis, particulate connector of claim 1, further having a contact resistance from about 50 mohms to about 2,000 mohms using a compression force from about 5 g to about 50 g.

7. The conductive, Z-axis, particulate connector of claim 1, wherein said central pillar has an axial cavity extending from said first end to said second end.

8. A compressible interconnect comprising:

an electrically insulating elastomer sheet; and at least one electrically conducting elastic column, occupying a hole formed in said elastomer sheet, to provide a localized conductive path through the thickness of said insulating elastomer sheet, said at least one electrically conducting elastic column having a central pillar of conductive spheroidal particles of a first average particle size, said central pillar further having a first end opposite a second end, at least said first end contacting a particulate cap including particles having a second average particle size, said second average particle size being less than said first average particle size.

9. The compressible interconnect of claim 8, further having a particulate cap at said second end.

10. The compressible interconnect of claim 8, wherein said first average particle size is from about 80 $\mu$m to about 180 $\mu$m.

11. The compressible interconnect of claim 8, wherein said second average particle size is from about 6 $\mu$m to about 40 $\mu$m.

12. The compressible interconnect of claim 8 wherein the ratio of said column diameter compared to the size of a said spheroidal particle is from about 2:1 to about 2.7:1.

13. The compressible interconnect of claim 8, wherein said at least one electrically conducting elastic column has a contact resistance from about 50 mohms to about 2,000 mohms using a compression force from about 5 g to about 50 g.

14. A compliant interconnect assembly to electrically connect a first electronic device to a second electronic device, said compliant interconnect assembly comprising:

a contact set including an electrically insulating flexible film having at least one conductive contact suspended therein; and a compressible interposer comprising an electrically insulating elastomer sheet as a matrix for at least one electrically conducting elastic column to provide a localized conductive path through the thickness of said elastomer sheet, said at least one electrically conducting elastic column comprising a central pillar of conductive spheroidal particles having a first average particle size, said central pillar having a first end opposite a second end, at least said first end having bonded thereto a particulate cap including conducting particles having a second average particle size, said second average particle size being less than said first average particle size, said compliant interconnect assembly being formed when said contact set lies adjacent said compressible interposer, said at least one conductive contact touching said at least one conducting elastic column for electrically connecting said first electronic device and said second electronic device abutting opposite sides of said compliant interconnect assembly.

15. A compliant interconnect assembly according to claim 14 wherein said electrically insulating elastomer sheet is a cured silicone elastomer sheet.

16. A compliant interconnect assembly according to claim 14 wherein said conducting particles are selected from the group consisting of metal particles, metal coated glass particles, metal coated ceramic particles, metal coated polymer particles and conductive carbon particles.

* * * * *